United States Patent
Wei et al.

(10) Patent No.: US 11,525,043 B2
(45) Date of Patent: Dec. 13, 2022

(54) HIGH LIGHT TRANSMITTANCE PHOTOVOLTAIC ENCAPSULATING MATERIAL

(71) Applicant: HANGZHOU FIRST APPLIED MATERIAL CO., LTD., Hangzhou (CN)

(72) Inventors: Mengjuan Wei, Hangzhou (CN); Yan Sang, Hangzhou (CN); Guangda Zhou, Hangzhou (CN); Xi Xiong, Hangzhou (CN); Hongbing Hou, Hangzhou (CN); Jianhua Lin, Hangzhou (CN)

(73) Assignee: HANGZHOU FIRST APPLIED MATERIAL CO., LTD., Hangzhou (CN)

( * ) Notice: Subject to any disclaimer, the term of this patent is extended or adjusted under 35 U.S.C. 154(b) by 160 days.

(21) Appl. No.: 16/630,465

(22) PCT Filed: Mar. 20, 2018

(86) PCT No.: PCT/CN2018/079509
§ 371 (c)(1),
(2) Date: Jan. 12, 2020

(87) PCT Pub. No.: WO2019/136825
PCT Pub. Date: Jul. 18, 2019

(65) Prior Publication Data
US 2021/0115204 A1    Apr. 22, 2021

(30) Foreign Application Priority Data
Jan. 10, 2018   (CN) .......................... 201810022274.9

(51) Int. Cl.
| | |
|---|---|
| C08J 5/18 | (2006.01) |
| C08J 3/24 | (2006.01) |
| C08K 5/07 | (2006.01) |
| C08K 5/3435 | (2006.01) |
| C08K 5/39 | (2006.01) |
| C08K 5/5425 | (2006.01) |
| H01L 31/048 | (2014.01) |

(52) U.S. Cl.
CPC . C08J 5/18 (2013.01); C08J 3/24 (2013.01); C08K 5/07 (2013.01); C08K 5/3435 (2013.01); C08K 5/39 (2013.01); C08K 5/5425 (2013.01); H01L 31/0481 (2013.01); C08J 2323/08 (2013.01); C08J 2351/06 (2013.01)

(58) Field of Classification Search
CPC .......... C08K 5/07; C08K 5/3435; C08K 5/39; C08K 5/5425; C08J 5/18; C08J 3/24; C08J 2323/08; C08J 2451/08; H01L 31/0481
See application file for complete search history.

(56) References Cited

U.S. PATENT DOCUMENTS

| | | | | |
|---|---|---|---|---|
| 2013/0167928 A1* | 7/2013 | Hiraike | ................... | C09J 7/245 428/355 R |
| 2015/0027516 A1* | 1/2015 | Rummens | ............. | H01L 31/049 136/251 |
| 2016/0272852 A1* | 9/2016 | Jin | ............................. | C09J 7/10 |

FOREIGN PATENT DOCUMENTS

| | | |
|---|---|---|
| CN | 106833406 A | 6/2017 |
| CN | 107266777 A | 10/2017 |
| CN | 107502232 A | 12/2017 |
| JP | 2010225926 A | 10/2010 |
| JP | 2011009483 A | 1/2011 |
| KR | 20160129363 A | 11/2016 |
| WO | 2016052070 A1 | 4/2016 |
| WO | WO-2016052070 A1 * | 4/2016 ........... C08K 5/3492 |

OTHER PUBLICATIONS

Machine translation of WO-2016052070-A1, Sato R. (Year: 2016).*
First Office Action(2019-571582); dated Jan. 12, 2021.
International Search Report (PCT/CN2018/079509); dated Sep. 27, 2018.
European Search Report (189004773); dated Dec. 17, 2021.

* cited by examiner

*Primary Examiner* — Mayla Gonzalez Ramos
(74) *Attorney, Agent, or Firm* — W&G Law Group

(57) ABSTRACT

The present disclosure relates to a high light transmittance photovoltaic encapsulating material, which is prepared by the following process: subjecting 100 mass parts of a photovoltaic encapsulating material matrix resin or a graft-modified matrix resin, 0.001 to 5 mass parts of an oxygen- or sulfur-containing compound, 0.01 to 10 mass parts of a reactive plasticize 0.01 to 1.5 mass parts of an initiator, 0.01 to 10 mass parts of an assistant cross-linker, 0.1 to 3.0 mass parts of a silane coupling agent, 0.1 to 0.4 mass parts of an ultraviolet light absorber, and 0.1 to 1.0 mass part of light stabilizer to pre-mixing, melt extrusion, film casting, cooling, slitting, and coiling. The light transmittance of the photovoltaic encapsulating material is improved, and the refractive indexes of glass/front-layer encapsulating material/cell match each other, thereby increasing the sunlight utilization ratio of a module, and optimizing the photoelectric conversion efficiency of the module.

10 Claims, No Drawings

HIGH LIGHT TRANSMITTANCE PHOTOVOLTAIC ENCAPSULATING MATERIAL

CROSS-REFERENCE TO RELATED APPLICATIONS

The present application is based on International Application No. PCT/CN2018/079509 filed Mar. 20, 2018, which claims priority to Chinese Patent Application No. 201810022274.9, filed on Jan. 10, 2018, the contents of which is incorporated herein by reference in its entirety.

TECHNICAL FIELD

The present disclosure is related to the field of encapsulating materials of photovoltaic modules, and particularly, to a high light transmittance photovoltaic encapsulating material.

BACKGROUND

According to the "13$^{th}$ Five-Year Plan" of the National Energy Administration, by the end of 2020, the installed capacity of solar power will reach 110 GW or more, of which the installed capacity of photovoltaic power generation will reach 105 GW or more. It indicates that the development scale is no longer the primary goal of the development of China's photovoltaic industry, and cost reduction and efficiency increase have become the more critical factor objective. One of the feasible method for effective cost reduction and efficiency increase is to improve a light transmittance of a front-layer encapsulating materials of photovoltaic modules.

The photovoltaic module is of a five-layered sandwich structure composed of an upper-layer glass, an upper-layer encapsulating material, a cell, a lower-layer encapsulating material, and a backboard or glass. The sunlight passes through the upper-layer glass and the upper-layer transparent encapsulating material and is converted into electrical energy on the cell. The absorption and loss of the sunlight in the module are closely related to a refractive index of material of each layer of the module, and some interactive optical reactions may occur once the cell is encapsulated. The interface of any two materials with different refractive indexes will cause light reflection, and optical loss can reduce the photoelectric conversion efficiency of the photovoltaic module. The refractive index of the encapsulating material affects the reflection loss of a glass-encapsulating layer interface and a silicon-anti-reflective film (ARC)-encapsulating layer interface. If the refractive index of the encapsulating material is equal to the geometric mean of the refractive indexes of the upper-layer glass and a silicon wafer, the reflectivity is zero, and the sunlight utilization ratio of the silicon wafer is maximized. For the photovoltaic encapsulating material, it is the most important to achieve the optimized matching of the refractive indexes of the glass, the front-layer encapsulating material and the cell, thereby avoiding absorption of light in a useful spectral range (wherein C—Si cell has a spectral range of 350 to 1200 nm). At present, the cell black silicon technology solves the problem that a diamond-cut polysilicon wafer has excessively high reflectivity. A black silicon material can capture almost all sunlight, and the wet black silicon technology increases the absorption of blue light, thereby greatly improving the photoelectric conversion efficiency. In order to avoid the restriction of the encapsulating material to a further improvement on the photoelectric conversion efficiency of the photovoltaic module, it is urgent to improve the light transmittance of the photovoltaic encapsulating material, and achieve the powerful combination and perfect matching of the glass, the encapsulating material and the cell.

At present, there are also published patents providing methods to improve the light transmission performances of encapsulating materials and reduce the photovoltaic encapsulating loss. Patent CN101353558A, without using an ultraviolet light absorbent and producing ultraviolet light cutoff, can better utilize the ultraviolet band of 300 to 400 nm, improve the light transmittance by increasing the absorption of light, and thus improve the photoelectric conversion efficiency of a cell; because the material does not contain the ultraviolet light absorber, the long-term ultraviolet resistance and mechanical properties of an EVA film may be affected. Patent CN102656705A improves the light transmittance and cell efficiency by doping the encapsulating material with a fluorescent material for wavelength conversion, but its absorption band is narrow, the amount of "red shift" is relatively small; there is significant self-absorption loss, and it needs to be verified whether the conversion efficiency of the down conversion material can be maintained stably for a long term or not. Patent CN107502232A adds a composite plasticizer of spiropyran and phthalate to an EVA resin to improve its light transmittance, but the plasticizer is easy to migrate in a high temperature and high humidity environment, thereby affecting the long-term reliability of the module; the nanometer graphene oxide added in the system is expensive in price and has a hydrophilic structure, and the water vapor barrier property of the prepared EVA film is questioned.

SUMMARY

The present disclosure provides a high light transmittance photovoltaic encapsulating material in order to overcome the technical problem of the prior art. In order to optimize and improve the photoelectric conversion efficiency of a module, the light absorption rate of the encapsulating material should be as low as possible, and the light transmittance should be as high as possible. On the one hand, by adding a reactive plasticizer into a photovoltaic encapsulating material system, a degree of crosslinking is improved, the occurrence of a crosslinking reaction can destroy the regularity of a photovoltaic encapsulating material segment, inhibit the crystallization of the segment, and reduce the size of a crystal nucleus, so that the grain size is smaller than the visible light wavelength, and the light transmittance of the photovoltaic encapsulating material is improved. On the other hand, for adjusting the refractive index of the encapsulating material, an oxygen- or sulfur-containing compound is introduced into the encapsulating material system to improve the refractive index of a front-layer encapsulating material, improve the light transmittance, and reduce the reflection of an encapsulating material-glass-cell interface. In this way, the refractive indexes of the glass/front-layer encapsulating material/cell can optimally match, the intensity of light incident upon the cell can be increased, and cell current and output power can be enhanced.

The above objectives can be achieved by a technical solution of the present disclosure, as described below: a high light transmittance photovoltaic encapsulating material is prepared by the following process: subjecting 100 mass parts of a photovoltaic encapsulating material matrix resin or a graft-modified matrix resin, 0.001 to 5 mass parts of an oxygen- or sulfur-containing compound, 0.01 to 10 mass parts of a reactive plasticizer, 0.01 to 1.5 mass parts of an initiator, 0.01 to 10 mass parts of an assistant cross-linker, 0.1 to 3.0 mass parts of a silane coupling agent, 0.1 to 0.4 mass parts of an ultraviolet light absorber, and 0.1 to 1.0 mass part of light stabilizer to pre-mixing, melt extrusion, film casting, cooling, slitting, coiling and the like, to prepare the high light transmittance photovoltaic encapsulating material.

Further, the photovoltaic encapsulating material matrix resin is a transparent polymer material, and the polymer material is formed by one or more, mixed in any ratio, of ethylene-vinyl acetate copolymer (EVA), ethylene-α-olefin copolymer, ethylene-methyl methacrylate copolymer and ethylene-methacrylate ionomer.

Further, the graft-modified matrix resin is formed by a graft modification of a matrix resin and a grafting monomer through a free radical grafting melt reaction; the grafting monomer is selected from the group consisting of vinyl siloxane, unsaturated monobasic acid, unsaturated dibasic acid, maleic anhydride, and dibutyl maleate.

Further, in the graft-modified matrix resin, a grafting ratio is 0.1 to 20 wt %; preferably, the grafting ratio is 1 to 10 wt %, and more preferably the grafting ratio is 1 to 5 wt %.

Further, the oxygen- or sulfur-containing compound has a refractive index of 1.48 to 1.70; the oxygen-containing compound is a compound containing an epoxy group, an ether group or an ester group; and the sulfur-containing compound is a compound containing a thioether group or a thioester group.

Further, the sulfur-containing compound is selected from the group consisting of thiocarbamate, thioaminoacetate, thioaminopropionate, thioaminobutyrate, dimethyl acrylate thiodiethanol diester, 4,4'-2-thiodibenzenedithiol dimethacrylate, 2,2'-mercaptoethyl sulfide dimethacrylate, thiodiethanol dimethacrylate, phenylthiophenol methacrylate, and phenyl thiophenol methacrylate.

Further, the reactive plasticizer molecule contains a molecular group participating a melt reaction under the action of free radicals. The initiator is composed of one or more, mixed in any ratio, of tert-butyl peroxyisopropyl carbonate, 2,5-dimethyl-2,5-bis(tert-butylperoxy)hexane, 1-bis(t-butylperoxy)-3,3,5-trimethylcyclohexane, tert-butylperoxy-2-ethylhexyl carbonate, 2,5-dimethyl-2,5-bis(t-butylperoxy)hexane, 1,1-bis(tert-butylperoxy)-3,3,5-trimethylcyclohexane, 1,1-bis(tert-amylperoxy)-3,3,5-trimethylcyclohexane, 1,1-bis(tert-amylperoxy)cyclohexane, 2,2-bis(tert-butylperoxy)butane, tert-amyl peroxycarbonate, and tert-butyl peroxy-3,3,5-trimethylhexanoate. The assistant cross-linker is a multifunctional acrylate or methacrylate compound.

Further, the reactive plasticizer is composed of one or more mixed in any ratio, of allyl acetate, allyl propionate, allyl butyrate, disubstituted allyl carbamate, disubstituted allyl aminoacetate, disubstituted allyl aminopropionate, disubstituted allyl aminobutyrate, allyl diglycol carbonate resin, and diallyl phthalate; and the assistant cross-linker is selected from the group consisting of pentaerythritol triacrylate, pentaerythritol tetraacrylate, ethoxylated pentaetythritol tetraacrylate, propoxylated pentaerythritol tetraacrylate, trimethylolpropane triacrylate, ethoxylated trimethylolpropane triacrylate, propoxylated trimethylolpropane triacrylate, ethoxylated glycerol triacrylate, propoxylated glycerol triacrylate, trimethylolpropane trimethacrylate, ethoxylated trimethylolpropane trimethacrylate, triethylene glycol dimethacrylate, diethylene glycol dimethacrylate, ethylene glycol dimethacrylate, polyethylene glycol (200) diacrylate, polyethylene glycol (400) diacrylate, polyethylene glycol (600) diacrylate, polyethylene glycol (200) dimethacrylate, polyethylene glycol (400) dimethacrylate, polyethylene glycol (600) dimethacrylate, ethoxylated bisphenol A diacrylate, ethoxylated bisphenol A dimethacrylate, 1,3-butanediol diacrylate, 1,4-butanediol diacrylate, and neopentyl glycol diacrylate.

Further, the ultraviolet light absorber is 2-hydroxy-4-n-octyloxoxybenzophenone; and the light stabilizer is bis-2, 2,6,6-tetramethylpiperidinyl sebacate.

Further, the high light transmittance photovoltaic encapsulating material has a degree of crosslinking of 55 to 96%, and a thickness of 0.10 to 1.00 mm, preferably 0.20 to 0.80 mm, more preferably 0.30 to 0.60 mm, and most preferably 0.40 to 0.50 mm.

According to the above technical solutions, the present disclosure has the following beneficial effects. The photovoltaic encapsulating material of the present disclosure has a relatively high light transmittance, and thus can improve the sunlight utilization ratio of the module, and improve the photoelectric conversion efficiency of the module. By adding the reactive plasticizer into the photovoltaic encapsulating material system, the degree of crosslinking thereof is improved, the occurrence of the crosslinking reaction can destroy the regularity of the photovoltaic encapsulating material segment, thereby inhibiting the crystallization of the segment, and reducing the size of the crystal nucleus. In this way, the grain size is smaller than the visible light wavelength, the light transmittance of the photovoltaic encapsulating material is improved, and the thermal stability and mechanical properties of the encapsulating material are also increased at the same time. By introducing the oxygen- or sulfur-containing compound into the encapsulating material system, the refractive index of the front-layer encapsulating material is improved to reduce the reflection of a glass-cell interface, thereby improving the photon efficiency, and improving the light transmittance of the photovoltaic encapsulating material. Therefore, the refractive indexes of the glass/the front-layer encapsulating material/the cell can well match each other, and the sunlight utilization ratio of the module is increased, and the photoelectric conversion efficiency of the module is optimized.

DESCRIPTION OF EMBODIMENTS

The present disclosure provides a high light transmittance photovoltaic encapsulating material.

The technical solutions in the embodiments of the present disclosure will be clearly and in detail described below. The described embodiments are merely a part of the embodiments of the present disclosure, and not all of the embodiments. All other embodiments obtained by those skilled in the art based on the embodiments of the present disclosure without creative efforts shall fall within the scope of the present disclosure.

Example 1

The present example provides an encapsulating material, in particular a high light transmittance photovoltaic encapsulating material.

In the present example, 100 mass parts of ethylene-vinyl acetate copolymer containing 28% of VA (vinyl acetate), 1 mass part of thiocarbamate, 5 mass parts of allyl acetate, 1 mass part of tert-butyl peroxyisopropyl carbonate, 5 mass parts of pentaerythritol triacrylate, 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and the like to obtain the photovoltaic encapsulating material, which is denoted by E-1.

Example 2

The present example provides an encapsulating material, in particular a high light transmittance photovoltaic encapsulating material.

In the present example, 100 mass parts of ethylene-vinyl acetate copolymer grafted vinyl siloxane (grafting ratio: 5 wt %) containing 28% of VA (vinyl acetate), 1 mass part of thiocarbamate, 5 mass parts of allyl acetate, 1 mass part of tert-butyl peroxyisopropyl carbonate, 5 mass parts of pentaerythritol triacrylate, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-2.

Example 3

The present example provides an encapsulating material, in particular a high light transmittance photovoltaic encapsulating material.

In the present example, 100 mass parts of ethylene-α-olefin copolymer, 1 mass part of thiaminoacetate, 5 mass parts of allyl acetate, 1 mass part of tert-butyl peroxyisopropyl carbonate, 5 mass parts of pentaerythritol triacrylate 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-3.

Example 4

The present example provides an encapsulating material, in particular a high light transmittance photovoltaic encapsulating material.

In the present example, 100 mass parts of ethylene-α-olefin copolymer grafted dibutyl maleate (grafting ratio: 5 wt %), 1 mass part of thiaminoacetate, 5 mass parts of allyl acetate, 1 mass part of tert-butyl peroxyisopropyl carbonate, 5 mass parts of pentaerythritol triacrylate, 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-4.

Example 5

The present example provides an encapsulating material, in particular a high light transmittance photovoltaic encapsulating material.

In the present example, 100 mass parts of ethylene-methyl methacrylate copolymer, 1 mass part of thioaminobutyrate, 5 mass parts of allyl acetate, 1 mass part of tert-butyl peroxyisopropyl carbonate, 5 mass parts of pentaerythritol triacrylate, 1 mass part of KH570, 0.1 mass part of 2-hydroxy-4-n-octyloxybenzophenone, and mass 0.1 part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-5.

Example 6

The present example provides an encapsulating material, in particular a high light transmittance photovoltaic encapsulating material.

In the present example, 100 mass parts of ethylene-methyl methacrylate copolymer grafted maleic anhydride (grafting ratio: 5 wt %), 1 mass part of thioaminobutyrate, 5 mass parts of allyl acetate, 1 mass part of tert-butyl peroxyisopropyl carbonate, 5 mass parts of pentaerythritol triacrylate, 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-6.

Example 7

The present example provides an encapsulating material, in particular a high light transmittance photovoltaic encapsulating material.

In the present example, 100 mass parts of ethylene-vinyl acetate copolymer containing 28% of VA (vinyl acetate), 1 mass part of dimethyl acrylate thiodiethanol diester, 5 mass parts of disubstituted allyl carbamate, 1 mass part of tert-butyl peroxyisopropyl carbonate, 5 mass parts of pentaerythritol triacrylate, mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-7.

Example 8

The present example provides an encapsulating material, in particular a high light transmittance photovoltaic encapsulating material.

In the present example, 100 mass parts of ethylene-α-olefin copolymer, 1 mass part of dimethyl acrylate thiodiethanol diester, 5 mass parts of disubstituted allyl carbamate, 1 mass part of tert-butyl peroxyisopropyl carbonate, 5 mass parts of pentaerythritol triacrylate, 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-8.

Example 9

The present example provides an encapsulating material, in particular a high light transmittance photovoltaic encapsulating material.

In the present example, 100 mass parts of ethylene-methyl methacrylate, 1 mass part of dimethyl acrylate thiodiethanol diester, 5 mass parts of disubstituted allyl carbamate, 1 mass part of 2,5-dimethyl-2,5-bis(t-butylperoxy)hexane, 5 mass parts of pentaerythritol triacrylate, 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-9.

Example 10

The present example provides an encapsulating material, in particular a high light transmittance photovoltaic encapsulating material.

In the present example, 100 mass parts of ethylene-vinyl acetate copolymer containing 26% of VA (vinyl acetate), 1 mass part of thiodiethanol dimethacrylate, 5 mass parts of allyl diglycol carbonate resin, 1 mass part of 2,5-dimethyl-2,5-bis(t-butylperoxy)hexane, 5 mass parts of pentaerythritol triacrylate, 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-10.

Example 11

The present example provides an encapsulating material, in particular a high light transmittance photovoltaic encapsulating material.

In the present example, 100 mass parts of ethylene-vinyl acetate copolymer containing 30% of VA (vinyl acetate), 1 mass part of thiodiethanol dimethacrylate, 5 mass parts of diallyl phthalate, 1 mass part of tert-butyl peroxy-3,3,5-trimethylhexanoate, 5 mass parts of ethoxylated glycerol triacrylate, 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-11.

Example 12

The present example provides an encapsulating material, in particular a high light transmittance photovoltaic encapsulating material.

In the present example, 100 mass parts of ethylene-α-olefin copolymer, 1 mass part of phenylthiophenol methacrylate, 5 mass parts of disubstituted allyl aminopropionate, 1 mass part of tert-butylperoxy-2-ethylhexyl carbonate, 5 mass parts of propoxylated pentaerythritol tetraacrylate, 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-12.

Example 13

The present example provides an encapsulating material, in particular a high light transmittance photovoltaic encapsulating material.

In the present example, 100 mass parts of ethylene-methyl methacrylate, 1 mass part of phenylthiophenol methacrylate, 5 mass parts of disubstituted allyl aminopropionate, 1 mass part of tert-butylperoxy-2-ethylhexyl carbonate, 5 mass parts of propoxylated pentaerythritol tetraacrylate, 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-13.

Example 14

The present example provides an encapsulating material, in particular a high light transmittance photovoltaic encapsulating material.

In the present example, 100 mass parts of ethylene-methacrylate ionomer, 1 mass part of phenylthiophenol methacrylate, 5 mass parts of disubstituted allyl aminopropionate, 1 mass part of tert-butylperoxy-2-ethylhexyl carbonate, 5 mass parts of propoxylated pentaerythritol tetraacrylate, 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-14.

Example 15

The present example provides an encapsulating material, in particular a high light transmittance photovoltaic encapsulating material.

In the present example, 100 mass parts of ethylene-methacrylate ionomer grafted dibutyl maleate, 1 mass part of phenylthiophenol methacrylate, 5 mass parts of disubstituted allyl aminopropionate, 1 mass part of tert-butylperoxy-2-ethylhexyl carbonate, 5 mass parts of propoxylated pentaerythritol tetraacrylate, 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-15.

Example 16

The present example provides an encapsulating material, in particular a high light transmittance photovoltaic encapsulating material.

In the present example, 100 mass parts of ethylene-methacrylate ionomer, 1 mass part of thiodiethanol dimethacrylate, 5 mass parts of diallyl phthalate, 1 mass part of tert-butylperoxy-2-ethylhexyl carbonate, 5 mass parts of propoxylated pentaerythritol tetraacrylate, 1 mass part of KH570, 0.1 mass part of 2-hydroxy-4-n-octyoxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by E-16.

Comparative Example 1

In the present example, 100 mass parts of ethylene-vinyl acetate copolymer containing 28% of VA (vinyl acetate) was added and uniformly mixed with 1 mass part of tert-butyl peroxyisopropyl carbonate, 5 mass parts of pentaerythritol triacrylate, 1 mass part of KH570, 0.1 mass part of 2-hydroxy-4-n-octyoxybenzophenone, and 0.1 mass part of bis-2,2,6,6-tetramethylpiperidinyl sebacate, and the above mixture was subjected to premixing, melt extrusion, film casting, cooling, slitting, coiling and other working procedures to obtain the photovoltaic encapsulating material, which is denoted by C-1.

Comparative Example 2

In the present example, 100 mass parts of ethylene-α-olefin copolymer was added and mixed with 1 mass part of tert-butyl peroxyisopropyl carbonate, 5 mass parts of pentaerythritol triacrylate, 1 mass part of KR570, 0.1 mass part of 2-hydroxy-4-n-octyloxybenzophenone, and 0.1 mass part of bis-2,2,6,6-tetramethylpiperidinyl sebacate to be uniformly mixed, and the above mixture was subjected to premixing, melt extrusion, film casting, cooling, slitting, coiling and other working procedures to obtain the photovoltaic encapsulating material, which is denoted by C-2.

Comparative Example 3

In the present example, 100 mass parts of ethylene-methyl methacrylate was added and mixed with 1 mass part of tert-butyl peroxyisopropyl carbonate, 5 mass parts of pentaerythritol triacrylate, 1 mass part of KH570, 0.1 mass part of 2-hydroxy-4-n-octyloxybenzophenone, and 0.1 mass part of bis-2,2,6,6-tetramethylpiperidinyl sebacate to be uniformly mixed, and the above mixture was subjected to premixing, melt extrusion, film casting, cooling, slitting, coiling and other working procedures to obtain the photovoltaic encapsulating material, which is denoted by C-3.

Comparative Example 4

In the present example, 90 wt % of ethylene-vinyl acetate copolymer (containing 28% of vinyl acetate (VA), DuPont, USA) and 10 wt % of poly olefin were taken. 100 mass parts of the above matrix resin, 1 mass part of tert-butyl peroxyisopropyl carbonate, 5 mass parts of pentaerythritol triacrylate, 1 mass part of KH570, 0.1 mass part of 2-hydroxy-4-n-octyloxybenzophenone, and 0.1 mass part of bis-2,2,6,6-tetramethylpiperidinyl sebacate were uniformly mixed, and the above mixture was subjected to premixing, melt extrusion, film casting, cooling, slitting, coiling and other working procedures to obtain the photovoltaic encapsulating material, which is denoted by C-4.

Performance Test

The transmittance test was performed on the encapsulating materials of Examples 1 to 16 and Comparative Examples 1 to 4 after the encapsulating materials were laminated. After the lamination, a coating film of each of Examples and Comparative Examples has a thickness of 0.45 mm. The light transmittance test was conducted according to GB/T 2410-2008, and the light transmittance of the coating film at 400 to 700 nm was measured with an ultraviolet-visible spectrophotometer.

TABLE 1

Test results of encapsulating materials of Examples 1 to 16 and Comparative Examples 1 to 4

| Encapsulating materials | Light transmittance (%) |
| --- | --- |
| Example 1 | 92.29 |
| Example 2 | 92.44 |
| Example 3 | 92.35 |
| Example 4 | 92.51 |
| Example 5 | 92.33 |
| Example 6 | 92.47 |
| Example 7 | 92.28 |
| Example 8 | 92.52 |
| Example 9 | 92.48 |
| Example 10 | 92.03 |
| Example 11 | 92.55 |
| Example 12 | 92.48 |
| Example 13 | 92.37 |
| Example 14 | 92.34 |
| Example 15 | 92.41 |
| Example 16 | 92.46 |
| Comparative Example 1 | 91.56 |
| Comparative Example 2 | 91.91 |
| Comparative Example 3 | 91.79 |
| Comparative Example 4 | 91.84 |

From the comparison of the light transmittance performance test data of the above examples and comparative examples, it can be seen that the photovoltaic package material according to the present disclosure has higher light transmittance above 92%. According to the above examples, it can be known that, by adding the reactive plasticizer to a photovoltaic encapsulating material system, the degree of crosslinking can be improved by the crosslinking reaction, which destroys the regularity of a photovoltaic encapsulating material segment, inhibits the crystallization of the segment, and reduces the size of a crystal nucleus, such that the grain size is smaller than the visible light wavelength, and the light transmittance of the photovoltaic encapsulating material is improved. In addition, by introducing a oxygen- or sulfur-containing compound into the encapsulating material system, the refractive index of a front-layer encapsulating material is improved to reduce the reflection of a glass-cell interface, and the photon efficiency and the light transmittance of the photovoltaic encapsulating material are enhanced, such that the refractive indexes of the glass/the front-layer encapsulating material/the cell can well match each other, the sunlight utilization ratio of a module is increased, and thus the photoelectric conversion efficiency of the module are optimized.

The above detailed description is to help those skilled in the art on understanding and implementing the present application, but not intended to limit the protection scope of the present disclosure. The present application is not limited to the above embodiments, any equivalent variations or modifications made in accordance with the spirit of the present disclosure should fall within the scope of the present disclosure.

What is claimed is:

1. A high light transmittance photovoltaic encapsulating material, prepared by the following substances: 100 mass parts of a photovoltaic encapsulating material matrix resin or a graft-modified matrix resin, 0.001 to 5 mass parts of an oxygen- or sulfur-containing compound, 0.01 to 10 mass parts of a reactive plasticizer, 0.01 to 1.5 mass parts of an initiator, 0.01 to 10 mass parts of an assistant cross-linker, 0.1 to 3.0 mass parts of a silane coupling agent, 0.1 to 0.4 mass parts of an ultraviolet light absorber, and 0.1 to 1.0 mass part of light stabilizer wherein the reactive plasticizer is composed of one or more, mixed in any ratio, of allyl acetate, allyl propionate, allyl butyrate, disubstituted allyl carbamate, disubstituted allyl aminoacetate, disubstituted allyl aminopropionate, disubstituted allyl aminobutyrate, and allyl diglycol carbonate resin.

2. The high light transmittance photovoltaic encapsulating material according to claim 1, wherein the photovoltaic encapsulating material matrix resin is a transparent polymer material, and the polymer material is formed by one or more, mixed in any ratio, of ethylene-vinyl acetate copolymer, ethylene-α-olefin copolymer, ethylene-methyl methacrylate copolymer and ethylene-methacrylate ionomer.

3. The high light transmittance photovoltaic encapsulating material according to claim 1, wherein the graft-modified matrix resin is formed by a graft modification of a matrix resin and a grafting monomer through a free radical grafting melt reaction; the grafting monomer is selected from the group consisting of vinyl siloxane, unsaturated monobasic acid, unsaturated dibasic acid, maleic anhydride, and dibutyl maleate.

4. The high light transmittance photovoltaic encapsulating material according to claim 3, wherein in the graft-modified matrix resin, a grafting ratio is 0.1 to 20 wt %; preferably, the grafting ratio is 1 to 10 wt %, and more preferably the grafting ratio is 1 to 5 wt %.

5. The high light transmittance photovoltaic encapsulating material according to claim 1, wherein the oxygen- or sulfur-containing compound has a refractive index of 1.48 to 1.70; the oxygen-containing compound is a compound containing an epoxy group, an ether group or an ester group; and the sulfur-containing compound is a compound containing a thioether group or a thioester group.

6. The high light transmittance photovoltaic encapsulating material according to claim 5, wherein the sulfur-containing compound is selected from the group consisting of thiocarbamate, thioaminoacetate, thioaminopropionate, thioaminobutyrate, dimethyl acrylate thiodiethanol diester, 4,4'-2-thiodibenzenedithiol dimethacrylate, 2,2'-mercaptoethyl sulfide dimethacrylate, thiodiethanol dimethacrylate, phenylthiophenol methacrylate, and phenylthiophenol methacrylate.

7. The high light transmittance photovoltaic encapsulating material according to claim 1, wherein the reactive plasticizer molecule contains a molecular group participating a melt reaction under the action of free radicals; the initiator is composed of one or more, mixed in any ratio, of tert-butyl peroxyisopropyl carbonate, 2,5-dimethyl-2,5-bis(tert-butylperoxy)hexane, 1-bis(t-butylperoxy)-3,3,5-trimethylcyclohexane, tert-butylperoxy-2-ethylhexyl carbonate, 2,5-dimethyl-2,5-bis(t-butylperoxy)hexane, 1,1-bis(tert-butylperoxy)-3,3,5-trimethylcyclohexane, 1,1-bis(tert-amylperoxy)-3,3,5-trimethylcyclohexane, 1,1-bis(tert-amylperoxy)cyclohexane, 2,2-bis(tert-butylperoxy)butane, tert-amyl peroxycarbonate, and tert-butyl peroxy-3,3,5-trimethylhexanoate; and the assistant cross-linker is a multifunctional acrylate or methacrylate compound.

8. The high light transmittance photovoltaic encapsulating material according to claim 7, wherein the assistant cross-linker is selected from the group consisting of pentaerythritol triacrylate, pentaerythritol tetraacrylate, ethoxylated pentaerythritol tetraacrylate, propoxylated pentaerythritol tetraacrylate, trimethylolpropane triacrylate, ethoxylated trimethylolpropane triacrylate, propoxylated trimethylolpropane triacrylate, ethoxylated glycerol triacrylate, propoxylated glycerol triacrylate, trimethylolpropane trimethacrylate, ethoxylated trimethylolpropane trimethacrylate, triethylene glycol dimethacrylate, diethylene glycol dimethacrylate, ethylene glycol dimethacrylate, polyethylene glycol (200) diacrylate, polyethylene glycol (400) diacrylate, polyethylene glycol (600) diacrylate, polyethylene glycol (200) dimethacrylate, polyethylene glycol (400) dimethacrylate, polyethylene glycol (600) dimethacrylate, ethoxylated bisphenol A diacrylate, ethoxylated bisphenol A dimethacrylate, 1,3-butanediol diacrylate, 1,4-butanediol diacrylate, and neopentyl glycol diacrylate.

9. The high light transmittance photovoltaic encapsulating material according to claim 1, wherein the ultraviolet light absorber is 2-hydroxy-4-n-octyloxybenzophenone; and the light stabilizer is bis-2,2,6,6-tetramethylpiperidinyl sebacate.

10. The high light transmittance photovoltaic encapsulating material according to claim 1, wherein the high light transmittance photovoltaic encapsulating material has a degree of crosslinking of 55 to 96%, and a thickness of 0.10 to 1.00 mm, preferably 0.20 to 0.80 mm, more preferably 0.30 to 0.60 mm, and most preferably 0.40 to 0.50 mm.

* * * * *